(12) United States Patent
Kuang et al.

(10) Patent No.: US 11,800,673 B2
(45) Date of Patent: Oct. 24, 2023

(54) ELECTRONIC DEVICE AND BOARD MODULE THEREOF

(71) Applicant: Wistron Corp., New Taipei (TW)

(72) Inventors: Lei Kuang, New Taipei (TW);
Chia-Hsin Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 149 days.

(21) Appl. No.: 17/090,824

(22) Filed: Nov. 5, 2020

(65) Prior Publication Data

US 2022/0087043 A1 Mar. 17, 2022

(30) Foreign Application Priority Data

Sep. 16, 2020 (CN) .......................... 202010974850.7

(51) Int. Cl.
*H05K 7/00* (2006.01)
*H05K 7/14* (2006.01)
*H01R 12/73* (2011.01)

(52) U.S. Cl.
CPC ......... *H05K 7/1405* (2013.01); *H05K 7/1404* (2013.01); *H05K 7/1409* (2013.01); *H05K 7/1487* (2013.01); *H05K 7/1489* (2013.01); *H01R 12/737* (2013.01)

(58) Field of Classification Search
None
See application file for complete search history.

(56) References Cited

U.S. PATENT DOCUMENTS

| | | | | |
|---|---|---|---|---|
| 5,340,340 A | * | 8/1994 | Hastings | H05K 7/1489 |
| 5,695,351 A | * | 12/1997 | Kimura | H01R 13/633 |
| | | | | 439/159 |
| 10,840,643 B1 | * | 11/2020 | Jin | H01R 12/722 |
| 11,064,624 B2 | * | 7/2021 | Sung | H05K 7/1409 |
| 11,291,134 B2 | * | 3/2022 | Huang | G06F 1/181 |
| 2006/0120170 A1 | * | 6/2006 | Chen | G11B 33/124 |
| 2009/0153002 A1 | * | 6/2009 | Kinoshita | B60R 11/0205 |
| | | | | 312/223.1 |
| 2010/0265679 A1 | | 10/2010 | Van Der Mee et al. | |
| 2011/0134599 A1 | * | 6/2011 | Li | G06F 1/187 |
| | | | | 361/679.34 |
| 2013/0279129 A1 | * | 10/2013 | Xie | G06F 1/16 |
| | | | | 361/752 |

* cited by examiner

*Primary Examiner* — Anthony Q Edwards
*Assistant Examiner* — Rashen E Morrison (57) ABSTRACT

An electronic device is provided. The electronic device includes a device housing, a circuit board, and a board module. The device housing includes a restriction unit. The circuit board includes a circuit board connector, wherein the circuit board is disposed in the device housing. The board module includes a module housing, a module board, a module connector, and a preload unit. The module connector is disposed on the module board. The preload unit and the module board are disposed on the module housing. The preload unit is connected to the restriction unit and applies a first elastic force toward the restriction unit. The module connector can thus be sufficiently connected to the circuit board connector.

20 Claims, 13 Drawing Sheets

ELECTRONIC DEVICE AND BOARD MODULE THEREOF

CROSS REFERENCE TO RELATED APPLICATIONS

This Application claims priority of China Patent Application No. 202010974850.7, filed on Sep. 16, 2020, the entirety of which is incorporated by reference herein.

BACKGROUND OF THE INVENTION

Field of the Invention

Embodiments of the present invention relates to an electronic device, and in particular to an electronic device with at least one board module.

Description of the Related Art

A conventional server has a plurality of server modules and a riser board. Each server module has a board module. The riser board includes a riser board connector. The board module comprises a module connector. The riser board connector needs to be connected to the module connector. Conventionally, due to the manufacturing tolerance and the assembly tolerance, it is difficult to ensure that the riser board is sufficiently connected to the module connector.

A conventional board module can be connected to the housing of a server via a module bracket. Conventionally, an interference is pre-designed between the module bracket and the housing to compensate for negative tolerance, and the riser board connector can thus be sufficiently connected to the module connector. However, when the assembly tolerance of the board module is the positive tolerance, the conventional design generates interference between the board module and the riser board, and damages the related elements.

BRIEF SUMMARY OF THE INVENTION

Embodiments of the invention are provided to address the aforementioned difficulty.

In one embodiment, an electronic device is provided. The electronic device includes a device housing, a circuit board, and a board module. The device housing comprises a restriction unit. The circuit board comprises a circuit board connector, wherein the circuit board is disposed in the device housing. The board module comprises a module housing, a module board, a module connector, and a preload unit. The module connector is disposed on the module board. The preload unit and the module board are disposed on the module housing. The preload unit is connected to the restriction unit and applies a first elastic force toward the restriction unit.

In one embodiment, the preload unit comprises a first bracket, a first slider, and at least one first elastic member. The first slider is sleeved into the first bracket. One end of the first elastic member is connected to the first bracket. The other end of the elastic member is connected to the first slider.

In one embodiment, the preload unit is adapted to be moved between a released state and a wedged state relative to the restriction unit, and when the preload unit is in the released state, the preload unit is separated from the restriction unit, and when the preload unit is in the wedged state, the preload unit is connected to the restriction unit.

In one embodiment, the preloading unit comprises a grip, the grip pivots on the first bracket and the first slider, and the grip is adapted to abut the restriction unit to move the preload unit relative to the restriction unit.

In one embodiment, the preload unit comprises a sleeve, a shaft, and a fastener. The first bracket comprises a bracket opening. The first slider comprises a slider opening. The sleeve partially passes through the bracket opening and is fixed to the first bracket via the fastener. The shaft passes through the slider opening and is fixed to the sleeve. At least a portion of the first elastic member is sleeved into the sleeve.

In one embodiment, the preload unit comprises a sleeve, a shaft, and a fastener. The first bracket comprises a bracket opening. The first slider comprises a slider opening. The sleeve partially passes through the bracket opening and is fixed to the first bracket via the fastener. The shaft passes through the slider opening and is fixed to the sleeve. The first slider comprises a slider protrusion. The first bracket comprises a bracket protrusion. One end of the first elastic member abuts the slider protrusion. The other end of the first elastic member abuts the bracket protrusion.

In one embodiment, the first slider comprises a slider post, the first bracket comprises a bracket opening, the slider post partially passes through the bracket opening, the first elastic member is sleeved into the slider post, one end of the first elastic member pushes the first bracket, and the other end of the first elastic member pushes the first slider.

In one embodiment, the restriction unit comprises a second slider. The second slider is adapted to be moved between a first slider position and a second slider position. The first slider comprises a first connection portion. The second slider comprises a second connection portion. In the wedged state, the second slider is in the first slider position and the second connection portion is adapted to abut the first connection portion. In the released state, the second slider is moved past the second slider position to the first slider position, and the second connection portion is separated from the first connection portion.

In one embodiment, the restriction unit comprises a second elastic member and a second bracket. One end of the second elastic member abuts the second bracket. The other end of the second elastic member abuts the second slider.

In one embodiment, the restriction unit further comprises a button and a third elastic member, one end of the third elastic member abuts the second bracket, the other end of the third elastic member abuts the button, and the button is sleeved into the second slider.

In one embodiment, the button is adapted to be moved between a first button position and a second button position. When the button is in the first button position, the second slider is in the first slider position. When the button is in the second button position, the second slider is in the second slider position.

In one embodiment, the second slider comprises a slider through hole and a slider inclined surface. The button comprises a button inclined surface. The slider inclined surface is disposed in the slider through hole. The button passes through the slider through hole. The button inclined surface contacts the slider inclined surface.

In one embodiment, the board module further comprises a push rod. The push rod pivots on the module board. The push rod is adapted to press the first slider.

In another embodiment, a board module is adapted to be disposed in the device housing and a restriction unit. The board module includes a module housing, a module board, a module connector, and a preload unit. The module board is disposed on the module housing. The module connector is disposed on the module board. The preload unit is disposed on the module housing, wherein the preload unit is connected to the device housing and applies a first elastic force toward the device housing.

In the embodiment of the invention, the preload unit provides the elastic force to push the module connector toward the circuit board connector, and to sufficiently connect the module connector to the circuit board connector. As to the negative manufacturing tolerance, the preload unit compensates the negative manufacturing tolerance, and the module connector can be sufficiently connected to the circuit board connector. As to the positive manufacturing tolerance, the module connector can be compressed without damaging the related elements. The reliability and lifespan of the electronic device can be improved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
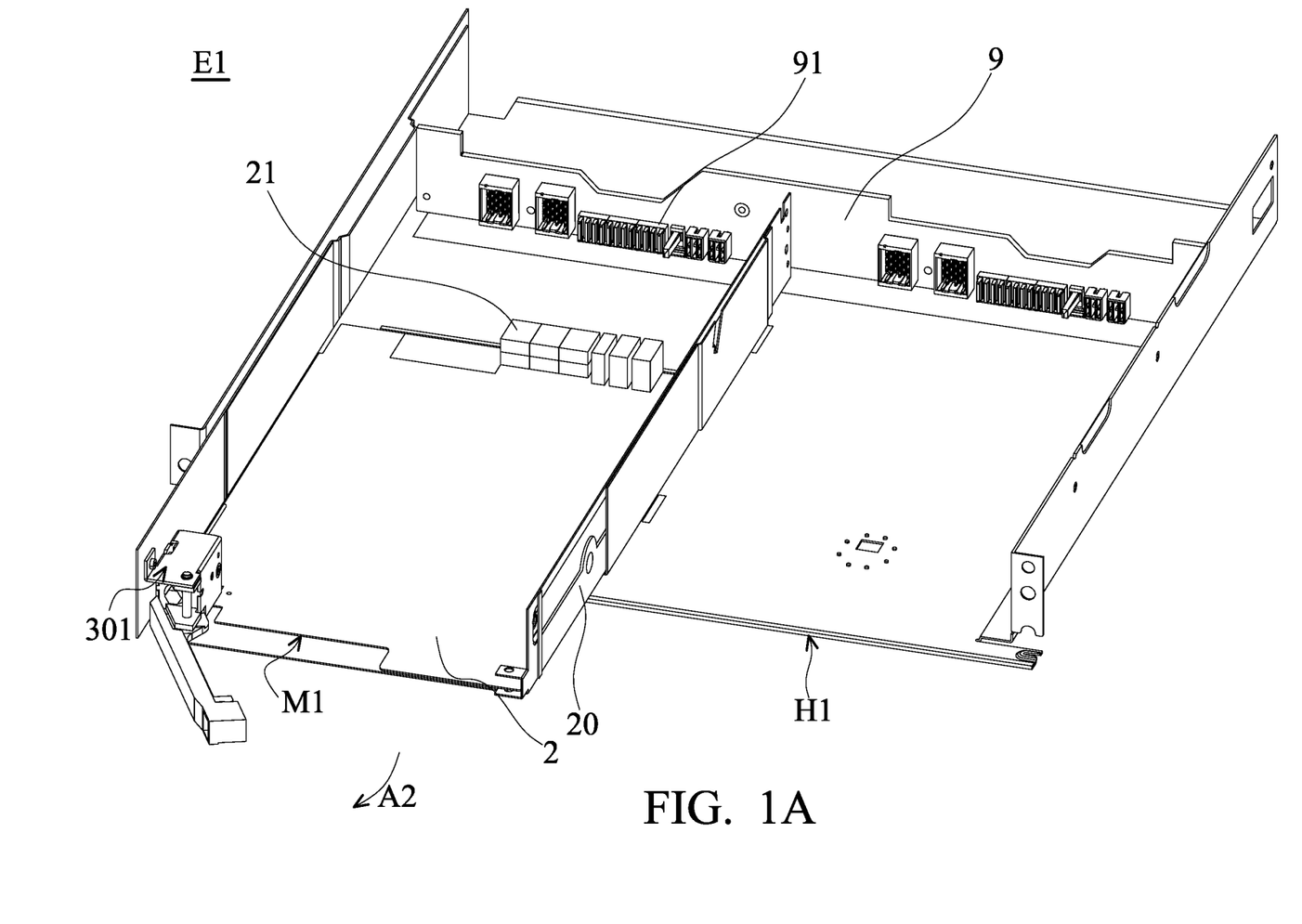
FIG. 1A shows an electronic device of a first embodiment of the invention, wherein a module connector is separated from a circuit board connector.
Figure 1B:
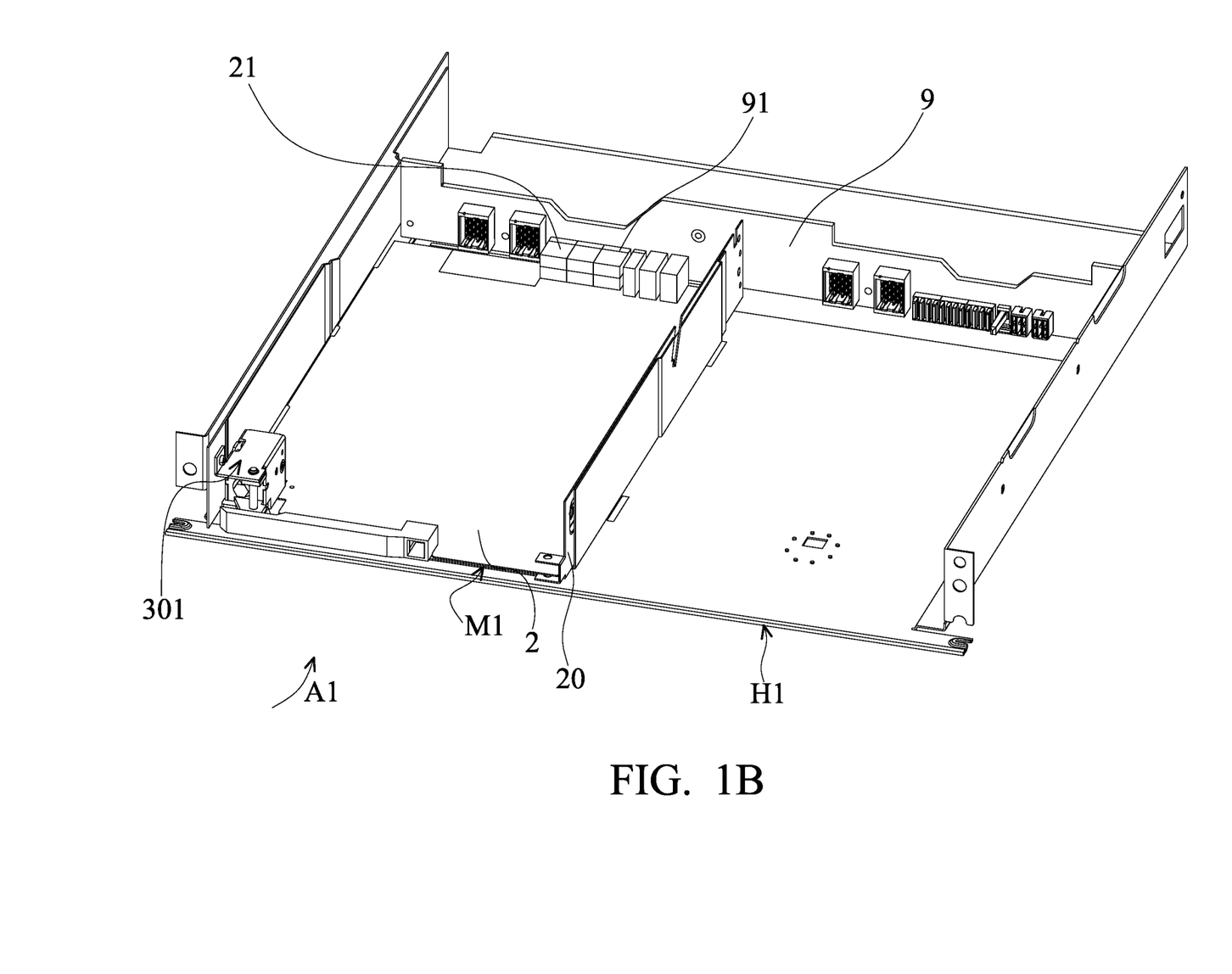
FIG. 1B shows the electronic device of the first embodiment of the invention, wherein the module connector is connected to circuit board connector.
Figure 3:
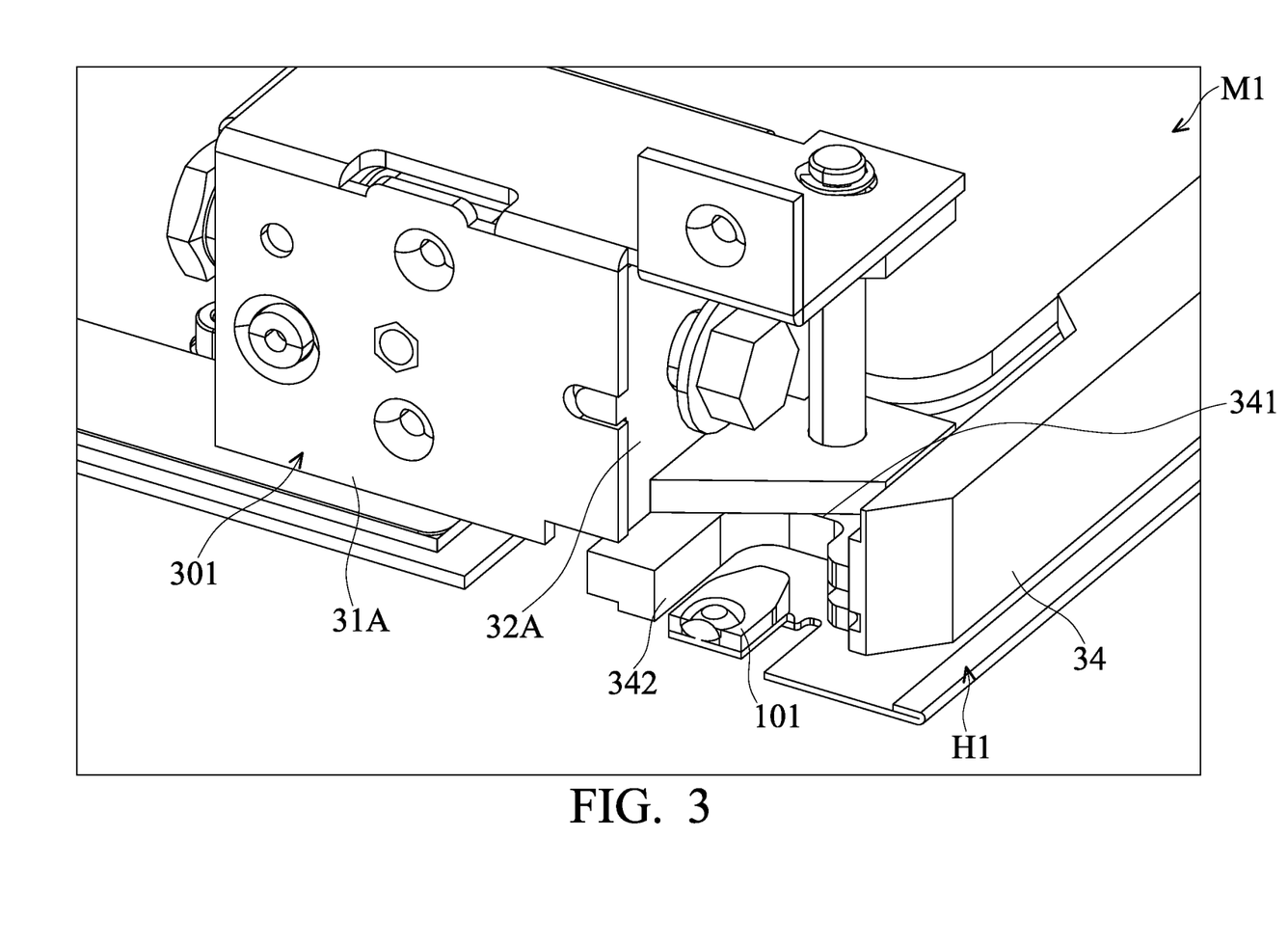
FIG. 3 shows a grip of the embodiment of the invention connected to a restriction unit.

FIGS. 1A and 1B show an electronic device of a first embodiment of the invention. FIG. 3 shows a grip of the embodiment of the invention connected to a restriction unit. With reference to FIGS. 1A, 1B and 3, the electronic device E1 of the first embodiment of the invention includes a device housing H1, a circuit board 9 and a board module M1. The device housing H1 comprises a restriction unit 101. The circuit board 9 comprises a circuit board connector 91. The circuit board 9 is disposed in the device housing H1. The board module M1 comprises a module housing 20, a module board 2, a module connector 21 and a preload unit 301. The module connector 21 is disposed on the module board 2. The preload unit 301 and the module board 2 are disposed on the module housing 20. The preload unit 301 is connected to the restriction unit 101 and applies a first elastic force toward the restriction unit 101 to move the board module M1 relative to the device housing H1, and the module connector 21 is sufficiently connected to the circuit board connector 91.

In one embodiment, the electronic device E1 is a server. The circuit board 9 is a riser board. The board module M1 is a server module.

Figure 2A:
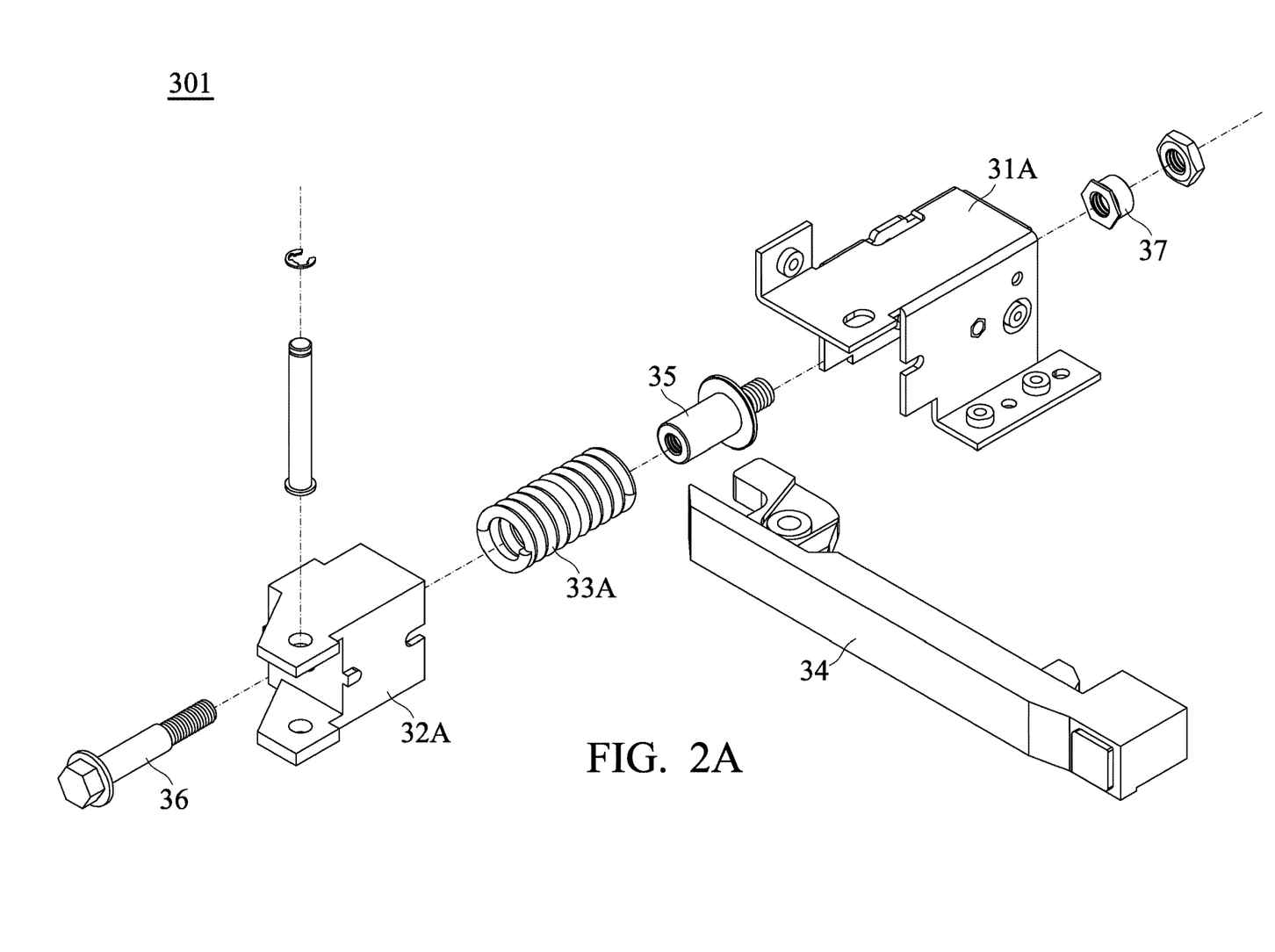
FIG. 2A is an exploded view of a preload unit of the first embodiment of the invention.
Figure 2B:
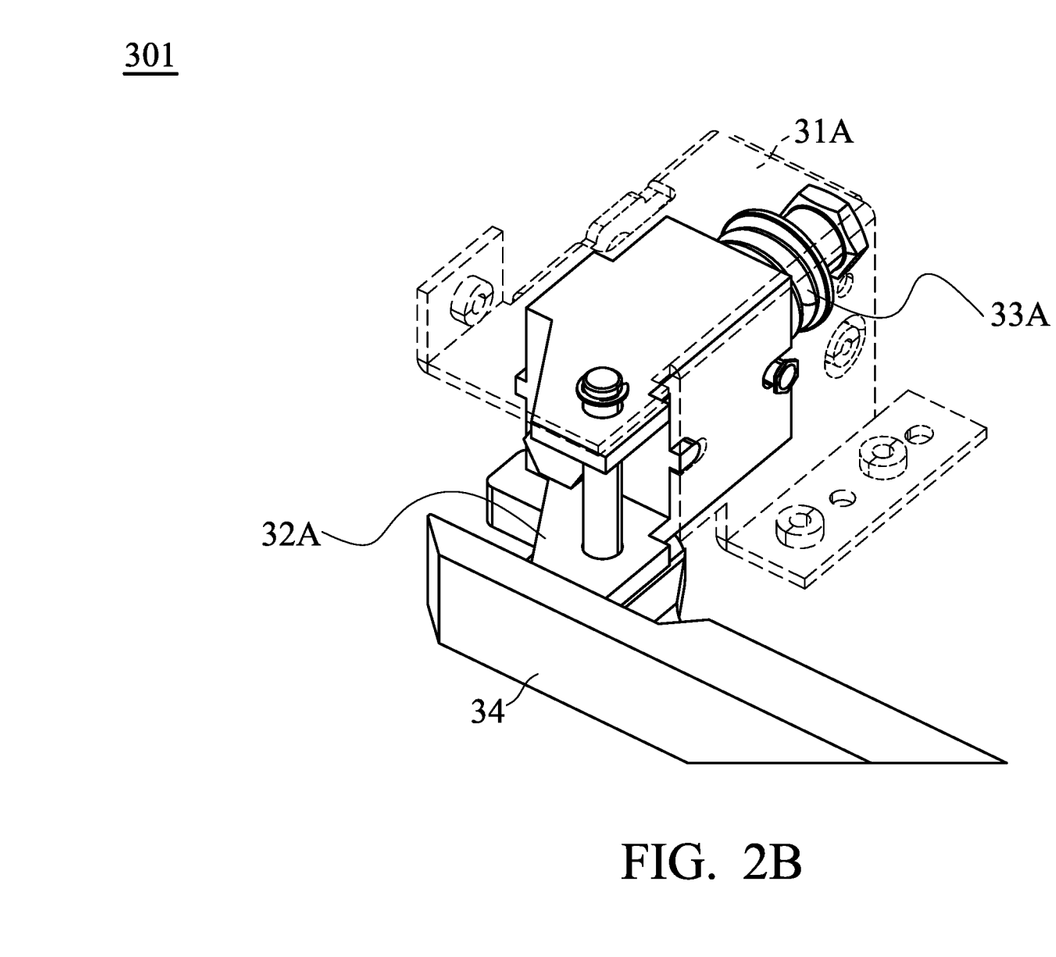
FIG. 2B is an assembly view of the preload unit of the first embodiment of the invention.

FIG. 2A is an exploded view of the preload unit of the first embodiment of the invention. FIG. 2B is an assembly view of the preload unit of the first embodiment of the invention. With reference to FIGS. 2A and 2B, in one embodiment, the preload unit 301 comprises a first bracket 31A, a first slider 32A and at least one first elastic member 33A. The first slider 32A is sleeved into the first bracket 31A. One end of the first elastic member 33A is directly or indirectly connected to the first bracket 31A. The other end of the elastic member 33A is connected to the first slider 32A.

With reference to FIGS. 2A, 2B and 3, in one embodiment, the preloading unit 301 comprises a grip 34. The grip 34 pivots on the first bracket 31A and the first slider 32A. The restriction unit 101 is a restriction protrusion. The grip 34 is adapted to abut the restriction protrusion.

With reference to FIGS. 1A, 1B and 3, in one embodiment, the grip 34 comprises a grip notch 341. The grip 34 is rotated in rotational directions A1, A2 relative to the first slider 31A to switch the grip between a released state (FIG. 1A) and a wedged state (FIG. 1B). When the grip 34 is rotated in the rotational direction A2 to be in the released state, the restriction unit 101 is adapted to be separated from the grip notch 341. When the grip 34 is rotated in the rotational direction A1 to be in the wedged state, the grip notch 341 is adapted to be inserted into the restriction unit 101, and a notch inner wall 342 of the grip notch 341 is adapted to push the restriction unit 101. The preload unit 301 is therefore connected to the restriction unit 101 and applies the first elastic force toward the restriction unit 101, and the board module M1 is moved relative to the device housing H1, and the module connector 21 is sufficiently connected to the circuit board connector 91.

Figure 2C:
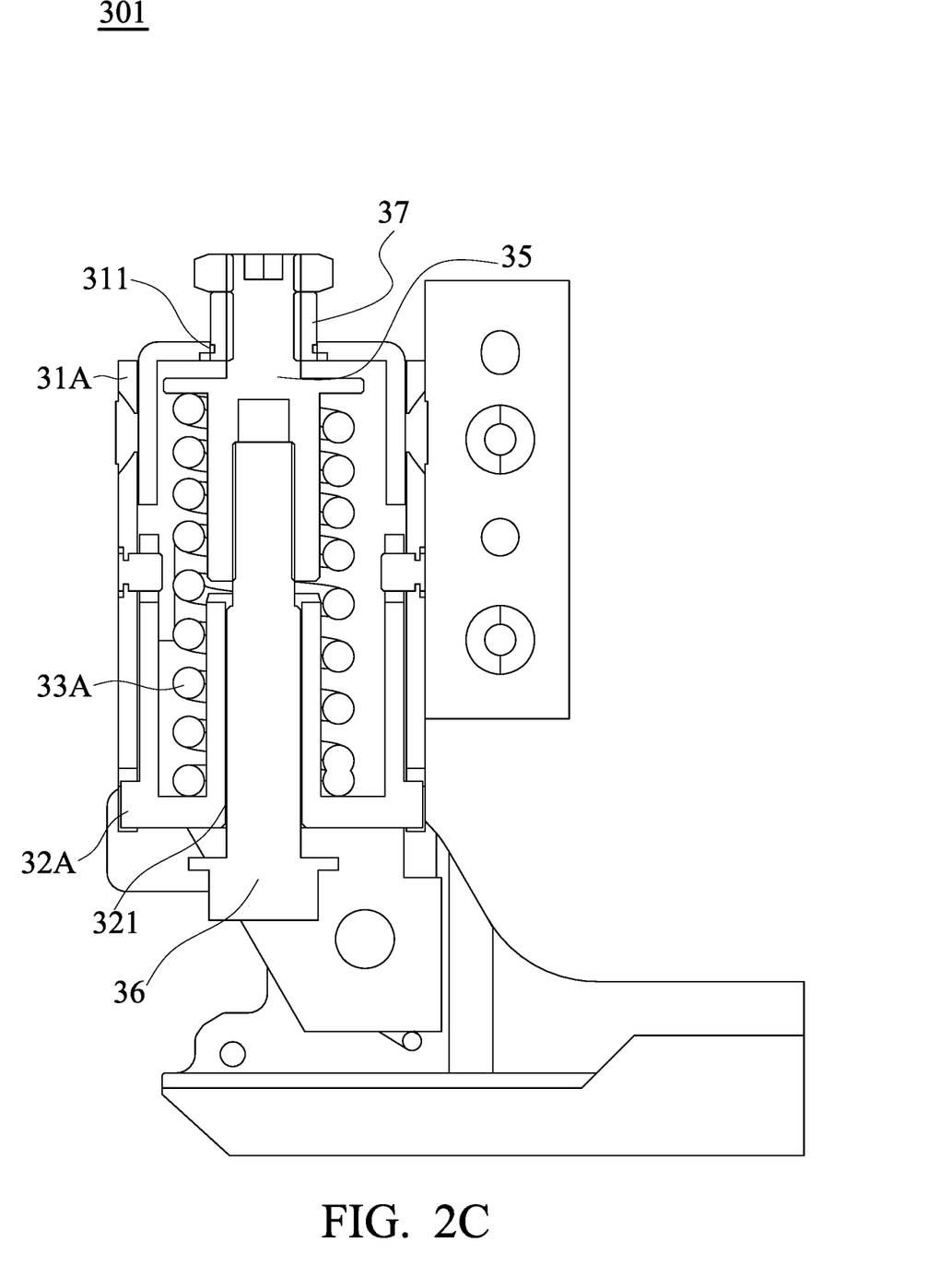
FIG. 2C is a cross sectional view of the preload unit of the first embodiment of the invention.

FIG. 2C is a cross sectional view of the preload unit of the first embodiment of the invention. With reference to FIGS. 2A, 2B and 2C, in one embodiment, the preload unit 301 comprises a sleeve 35, a shaft 36 and a fastener 37. The first bracket 31A comprises a bracket opening 311. The slider 32A comprises a slider opening 321. The sleeve 35 partially passes through the bracket opening 311 and is fixed to the first bracket 31A via the fastener 37. The shaft 36 passes through the slider opening 321 and is fixed to the sleeve 35. At least a portion of the first elastic member 33A is sleeved into the sleeve 35. The first elastic member 33A pushes the sleeve 35, and the sleeve 35 thus pushes the first bracket 31A. In one embodiment, the first elastic member 33A comprises a compression spring.

In one embodiment, by adjusting the connection length between the sleeve 35 and the shaft 36 (relative position between the sleeve 35 and the shaft 36), the compression amount of the first elastic member 33A can be modified.

In the embodiment of the invention, the preload unit provides the elastic force to push the module connector toward the circuit board connector, and to sufficiently connect the module connector to the circuit board connector. As to the negative manufacturing tolerance, the preload unit compensates the negative manufacturing tolerance, and the module connector can be sufficiently connected to the circuit board connector. As to the positive manufacturing tolerance, the module connector can be compressed without damaging the related elements. The reliability and lifespan of the electronic device can be improved.

Figure 4:
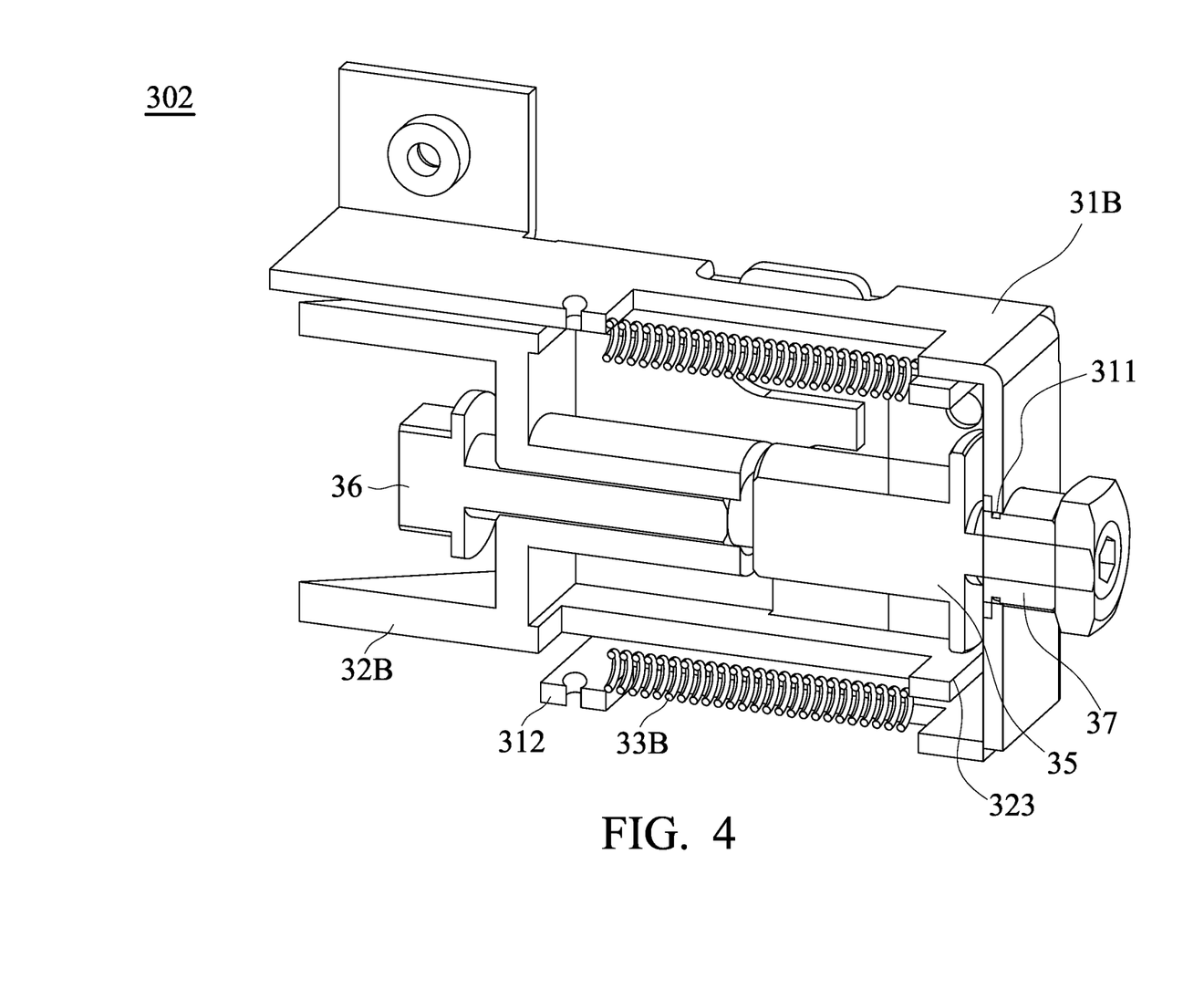
FIG. 4 shows a preload unit of a second embodiment of the invention.

FIG. 4 shows a preload unit of a second embodiment of the invention. With reference to FIG. 4, the preload unit 302 comprises a sleeve 35, a shaft 36 and a fastener 37. The first bracket 31B comprises a bracket opening 311. The first slider 32B comprises a slider opening 321. The sleeve 35 partially passes through the bracket opening 311 and is fixed to the first bracket 31B via the fastener 37. The shaft 36 passes through the slider opening 321 and is fixed to the sleeve 35. The first slider 32B comprises a slider protrusion 323. The first bracket 31B comprises a bracket protrusion 312. One end of the first elastic member 33B abuts the slider protrusion 323. The other end of the first elastic member 33B abuts the bracket protrusion 312. The first elastic member 33B comprises a tension spring.

Figure 5:
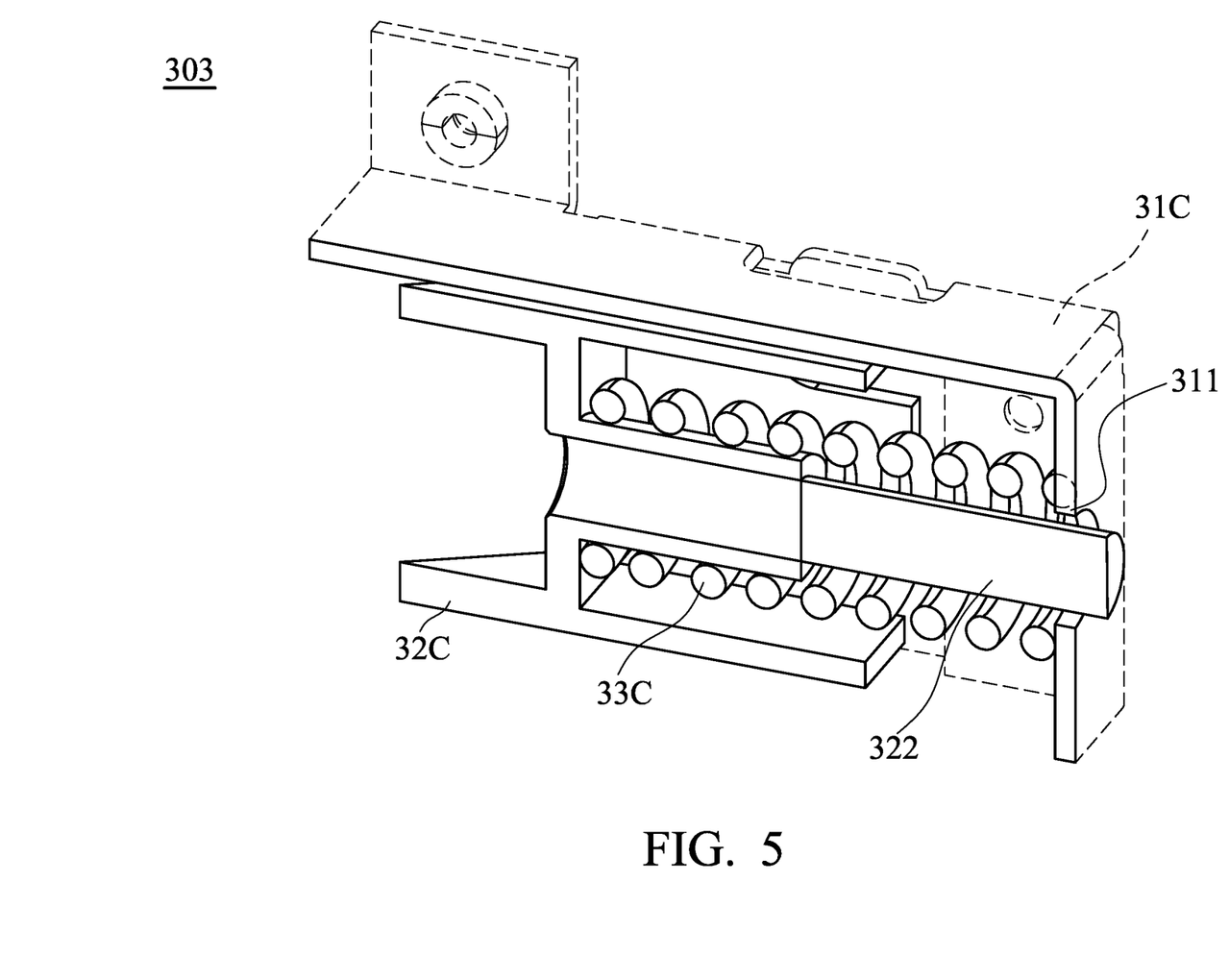
FIG. 5 shows a preload unit of a third embodiment of the invention.

FIG. 5 shows a preload unit of a third embodiment of the invention. With reference to FIG. 5, in the preload unit 303 of the third embodiment of the invention, the first slider 32C comprises a slider post 322. The first bracket 31C comprises a bracket opening 311. The slider post 322 partially passes through the bracket opening 311. The first elastic member 33C is sleeved into the slider post 321. One end of the first elastic member 33C pushes the first bracket 31C. The other end of the first elastic member 33C pushes the first slider 32C.

Similar to the first embodiment, in the second and the third embodiments, the preload unit provides the elastic force to push the module connector toward the circuit board connector, and to move the board module relative to the device housing. Therefore, the module connector is sufficiently connected to the circuit board connector.

Figure 6A:
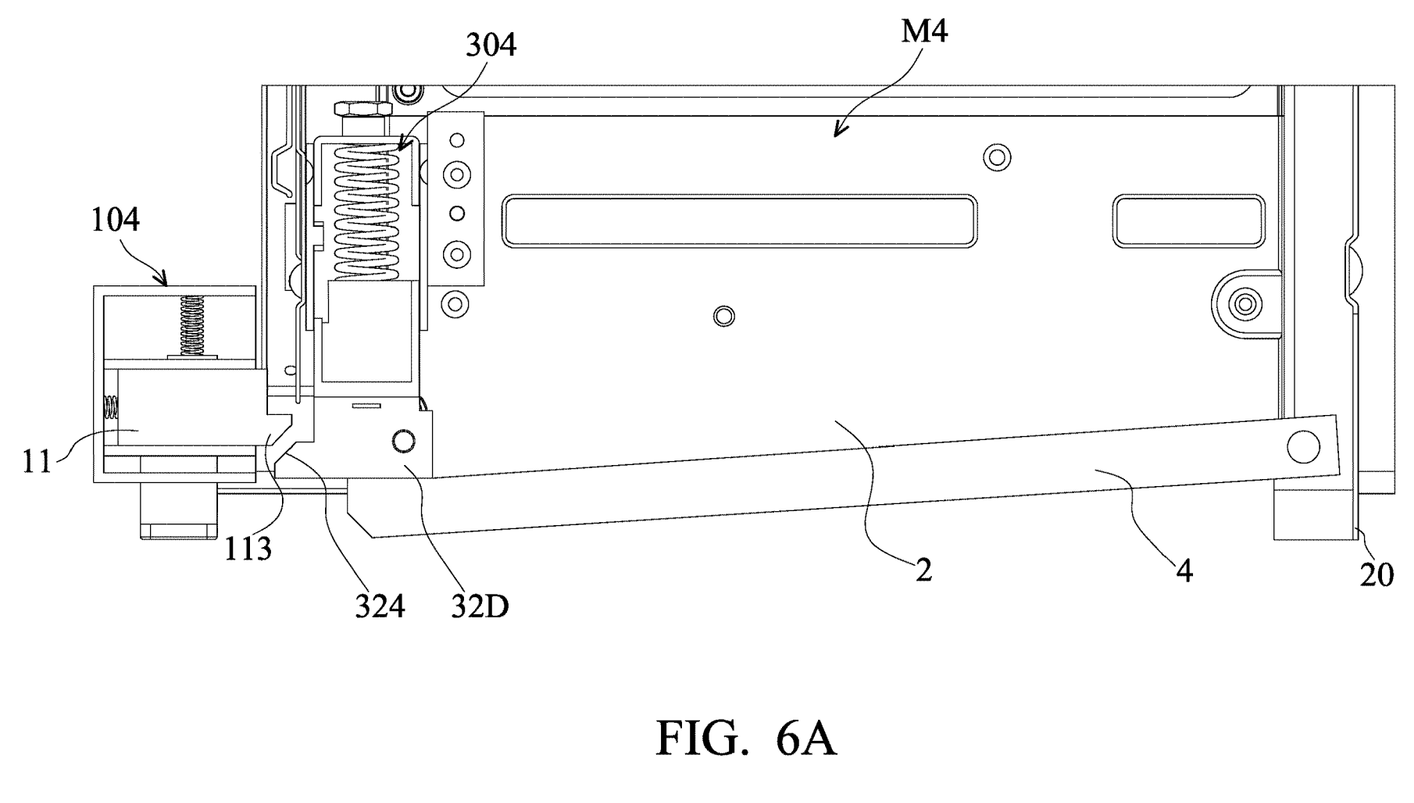
FIGS. 6A, 6B and 6C show an electronic device of a fourth embodiment of the invention.
Figure 6B:
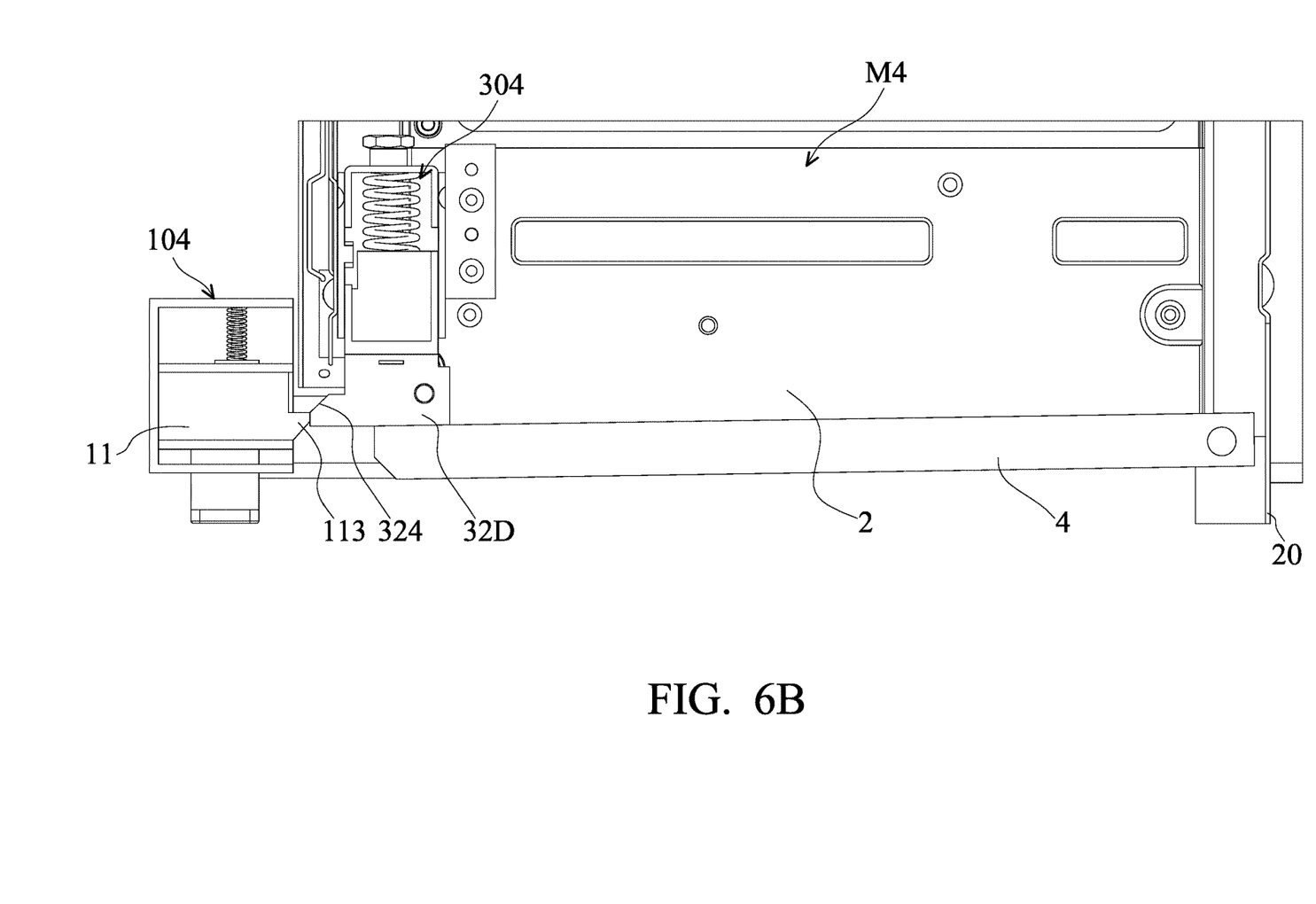
Figure 6C:
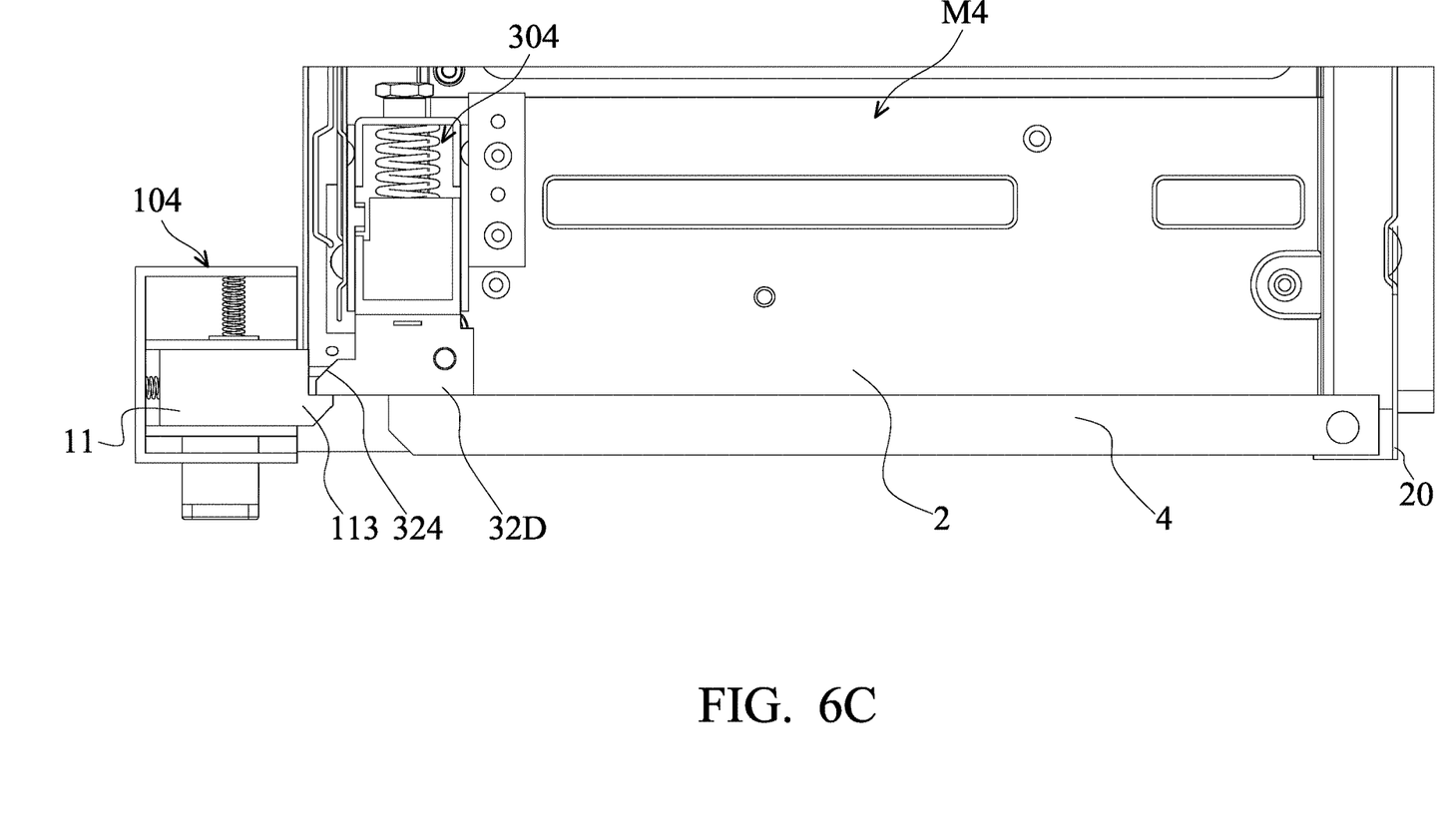

FIGS. 6A, 6B and 6C show an electronic device of a fourth embodiment of the invention. With reference to FIGS. 6A, 6B and 6C, in one embodiment, the board module M4 comprises a module housing 20, a module board 2, a preload unit 304, a restriction unit 104 and a pushing rod 4. The preload unit 304 pivots on one side of the module housing 20. The pushing rod 4 pivots on another side of the module housing 20. The preload unit 304 comprises a first bracket 31D, a first slider 32D and a first elastic member 33D. The assembly of the preload unit 304 is similar to the first embodiment, and the relative description is omitted. The pushing rod 4 contacts the first slider 32D of the preload unit 304. The restriction unit 104 is disposed in the device housing H1 and is adjacent to one side of the preload unit 304.

The restriction unit 104 comprises a second slider 11. The second slider 11 is adapted to be moved between a first slider position (FIGS. 6A and 6C) and a second slider position (FIG. 6B). The first slider 32D comprises a first connection portion 324. The second slider 11 comprises a second connection portion 113. In the wedged state (FIG. 6C), the second slider 11 is in the first slider position, and the second connection portion 113 is adapted to abut the first connection portion 324. In the released state, the second slider 11 is moved past the second slider position (FIG. 6B) to the first slider position (FIG. 6A), and the second connection portion 113 is separated from the first connection portion 324.

Figure 7A:
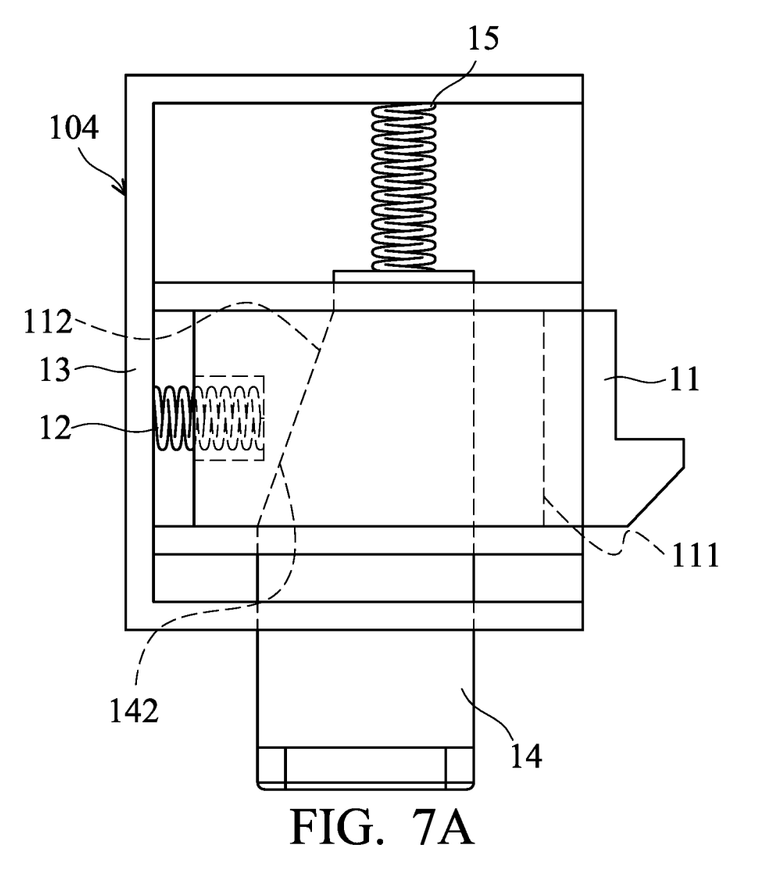
FIGS. 7A and 7B show the details of the restriction unit of the fourth embodiment of the invention.
Figure 7B:
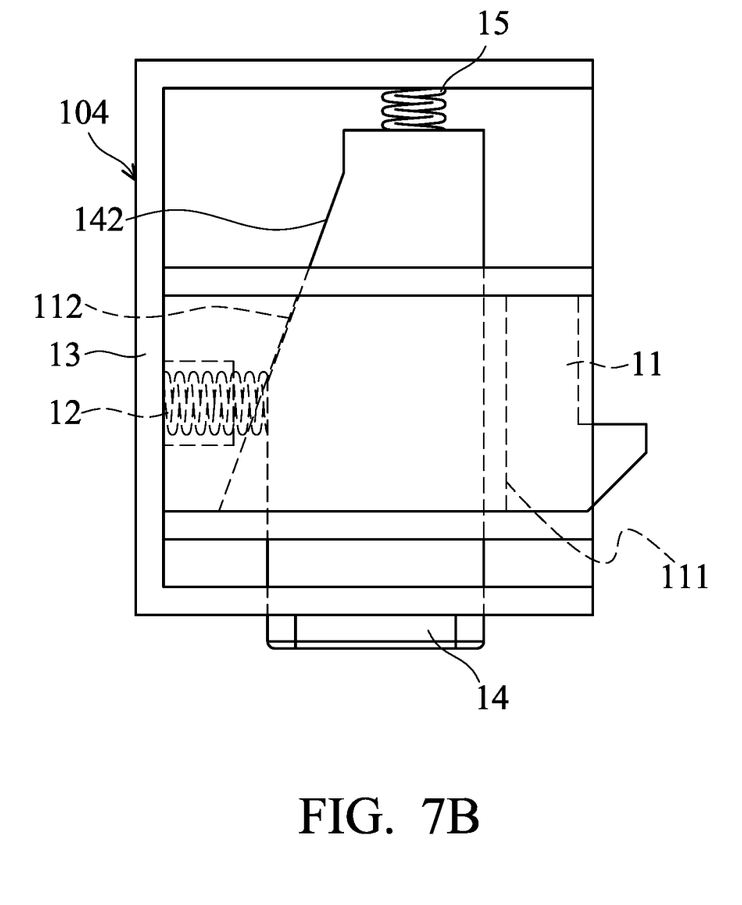

FIGS. 7A and 7B show the details of the restriction unit of the fourth embodiment of the invention. With reference to FIGS. 7A and 7B, in one embodiment, the restriction unit 104 comprises a second elastic member 12 and a second bracket 13. One end of the second elastic member 12 abuts the second bracket 13. The other end of the second elastic member 12 abuts the second slider 11.

With reference to FIGS. 7A and 7B, in one embodiment, the restriction unit 104 further comprises a button 14 and a third elastic member 15. One end of the third elastic member 15 abuts the second bracket 13. The other end of the third elastic member 15 abuts the button 14. The button 14 is sleeved into the second slider 11. In one embodiment, the second slider 11 comprises a slider through hole 111 and a slider inclined surface 112. The slider inclined surface 112 is disposed in the slider through hole 111. The button 14 comprises a button inclined surface 142. The button 14 passes through the slider through hole 111, and the button inclined surface 142 contacts the slider inclined surface 112.

The button 14 is adapted to be moved between a first button position (FIG. 7A) and a second button position (FIG. 7B). When the button 14 is in the first button position (FIG. 7A), the second slider 11 is in the first slider position. When the button 14 is in the second button position (FIG. 7B), the second slider 11 is in the second slider position.

In the fourth embodiment of the invention, the first slider 32D is pressed by the pushing rod 4 to be wedged to the second slider. By pressing the button 14, the second slider 11 can be moved to the second slider position (FIG. 7B) to release the first slider 32D. Similar to the first embodiment, the preload unit of the fourth embodiment of the invention provides the elastic force to push the module connector toward the circuit board connector, and to move the board module relative to the device housing. Therefore, the module connector is sufficiently connected to the circuit board connector.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An electronic device, comprising:
 a device housing, comprising a restriction unit, wherein the restriction unit is affixed to the device housing;
 a circuit board, comprising a circuit board connector, wherein the circuit board is disposed in the device housing; and
 a board module, comprising a module housing, a module board, a module connector, and a preload unit, wherein the module connector is disposed on the module board, the preload unit and the module board are moved with the module housing, the module board is disposed on the module housing, the preload unit is affixed to an inner wall of the module housing, and the preload unit is connected to the restriction unit and applies a first elastic force toward the restriction unit, wherein the module housing is moveable relative to the restriction unit.

2. The electronic device as claimed in claim 1, wherein the preload unit comprises a first bracket, a first slider, and at least one first elastic member, the first slider is sleeved into the first bracket, one end of the first elastic member is connected to the first bracket, and the other end of the elastic member is connected to the first slider.

3. The electronic device as claimed in claim 1, wherein the preload unit is adapted to be moved between a released state and a wedged state relative to the restriction unit, and when the preload unit is in the released state, the preload unit is separated from the restriction unit, and when the preload unit is in the wedged state, the preload unit is connected to the restriction unit.

4. The electronic device as claimed in claim 3, wherein the preloading unit comprises a grip, the grip pivots on the first bracket and the first slider, and the grip is adapted to abut the restriction unit to move the preload unit relative to the restriction unit.

5. The electronic device as claimed in claim 3, wherein the preload unit comprises a sleeve, a shaft, and a fastener, the first bracket comprises a bracket opening, the first slider comprises a slider opening, the sleeve partially passes through the bracket opening and is fixed to the first bracket via the fastener, the shaft passes through the slider opening and is fixed to the sleeve, and at least a portion of the first elastic member is sleeved into the sleeve.

6. The electronic device as claimed in claim 3, wherein the preload unit comprises a sleeve, a shaft, and a fastener, the first bracket comprises a bracket opening, the first slider comprises a slider opening, the sleeve partially passes through the bracket opening and is fixed to the first bracket via the fastener, the shaft passes through the slider opening and is fixed to the sleeve, the first slider comprises a slider protrusion, the first bracket comprises a bracket protrusion, one end of the first elastic member abuts the slider protrusion, and the other end of the first elastic member abuts the bracket protrusion.

7. The electronic device as claimed in claim 3, wherein the first slider comprises a slider post, the first bracket comprises a bracket opening, the slider post partially passes through the bracket opening, the first elastic member is sleeved into the slider post, one end of the first elastic member pushes the first bracket, and the other end of the first elastic member pushes the first slider.

8. The electronic device as claimed in claim 3, wherein the restriction unit comprises a second slider, the second slider is adapted to be moved between a first slider position and a second slider position, the first slider comprises a first connection portion, the second slider comprises a second connection portion, and in the wedged state, the second slider is in the first slider position, and the second connection portion is adapted to abut the first connection portion, and in the released state, the second slider is moved past the second slider position to the first slider position, and the second connection portion is separated from the first connection portion.

9. The electronic device as claimed in claim 8, wherein the restriction unit comprises a second elastic member and a second bracket, one end of the second elastic member abuts the second bracket, and the other end of the second elastic member abuts the second slider.

10. The electronic device as claimed in claim 9, wherein the restriction unit further comprises a button and a third elastic member, one end of the third elastic member abuts the second bracket, the other end of the third elastic member abuts the button, and the button is sleeved into the second slider.

11. The electronic device as claimed in claim 10, wherein the button is adapted to be moved between a first button position and a second button position, and when the button is in the first button position, the second slider is in the first slider position, and when the button is in the second button position, the second slider is in the second slider position.

12. The electronic device as claimed in claim 11, wherein the second slider comprises a slider through hole and a slider inclined surface, the button comprises a button inclined surface, the slider inclined surface is disposed in the slider through hole, the button passes through the slider through hole, and the button inclined surface contacts the slider inclined surface.

13. The electronic device as claimed in claim 3, wherein the board module further comprises a push rod, the push rod pivots on the module board, and the push rod is adapted to press the first slider.

14. A board module, adapted to be disposed in a device housing and a restriction unit, comprising:
a module housing;
a module board, disposed on the module housing;
a module connector, disposed on the module board; and
a preload unit, affixed to an inner wall of the module housing, wherein the preload unit is connected to the device housing and applies a first elastic force on the module housing toward the device housing, wherein the preload unit and the module board are moved with the module housing when the module housing is moved relative to the device housing.

15. The board module as claimed in claim 14, wherein the preload unit is adapted to be moved between a released state and a wedged state relative to the restriction unit, and when the preload unit is in the released state, the preload unit is separated from the restriction unit, and when the preload unit is in the wedged state, the preload unit is connected to the restriction unit.

16. The board module as claimed in claim 15, wherein the preload unit comprises a first bracket, a first slider, and at least one first elastic member, the first slider is sleeved into the first bracket, one end of the first elastic member is directly or indirectly connected to the first bracket, and the other end of the elastic member is connected to the first slider.

17. The board module as claimed in claim 15, wherein the preloading unit comprises a grip, and the grip pivots on the first bracket and the first slider.

18. The board module as claimed in claim 16, wherein the preload unit comprises a sleeve, a shaft, and a fastener, the first bracket comprises a bracket opening, the first slider comprises a slider opening, the sleeve partially passes through the bracket opening and is fixed to the first bracket via the fastener, the shaft passes through the slider opening and is fixed to the sleeve, at least a portion of the first elastic member is sleeved into the sleeve, the first elastic member pushes the sleeve, and the sleeve pushes the first bracket.

19. The board module as claimed in claim 16, wherein the preload unit comprises a sleeve, a shaft, and a fastener, the first bracket comprises a bracket opening, the first slider comprises a slider opening, the sleeve partially passes through the bracket opening and is fixed to the first bracket via the fastener, the shaft passes through the slider opening and is fixed to the sleeve, the first slider comprises a slider protrusion, the first bracket comprises a bracket protrusion, one end of the first elastic member abuts the slider protrusion, and the other end of the first elastic member abuts the bracket protrusion.

20. The board module as claimed in claim 16, wherein the first slider comprises a slider post, the first bracket comprises a bracket opening, the slider post partially passes through the bracket opening, the first elastic member is sleeved into the slider post, one end of the first elastic member pushes the first bracket, and the other end of the first elastic member pushes the first slider.

\* \* \* \* \*